(12) United States Patent
Unno et al.

(10) Patent No.: US 6,958,462 B2
(45) Date of Patent: Oct. 25, 2005

(54) CERAMIC HEATERS

(75) Inventors: Yutaka Unno, Handa (JP); Kazuhiro Nobori, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/386,002

(22) Filed: Mar. 11, 2003

(65) Prior Publication Data

US 2003/0173349 A1 Sep. 18, 2003

(30) Foreign Application Priority Data

Mar. 18, 2002 (JP) .................................... P2002-073532

(51) Int. Cl.⁷ ................................................ H05B 3/68
(52) U.S. Cl. .................................... 219/444.1; 219/541
(58) Field of Search ........................... 219/443.1, 444.1, 219/465.1, 466.1, 467.1, 468.1, 541, 543, 544, 546, 547, 548; 118/724, 725

(56) References Cited

U.S. PATENT DOCUMENTS

| | | | |
|---|---|---|---|
| 3,895,219 A | * 7/1975 | Richerson et al. | 219/553 |
| 4,952,783 A | * 8/1990 | Aufderheide et al. | 219/528 |
| 5,573,690 A | 11/1996 | Nobori et al. | |
| 5,616,024 A | * 4/1997 | Nobori et al. | 432/241 |
| 5,683,606 A | * 11/1997 | Ushikoshi et al. | 219/544 |
| 6,133,557 A | * 10/2000 | Kawanabe et al. | 219/544 |
| 6,423,949 B1 | * 7/2002 | Chen et al. | 219/444.1 |

FOREIGN PATENT DOCUMENTS

JP  2001-102157  4/2001

* cited by examiner

Primary Examiner—Sang Y. Paik
(74) Attorney, Agent, or Firm—Burr & Brown

(57) ABSTRACT

An object of the present invention is to provide a ceramic heater so that hot spots around the end portions of a heat resistor may be prevented. A ceramic heater has a ceramic substrate having a mounting face for an object to be heated, a heat resistor 3B embedded in the substrate and having end portions 3a, and a connecting member 6 electrically connected with the end portion 3a. At least one connecting member 6 substantially has an outer shape of a sphere, an ellipsoid of revolution, or a cylinder. The connecting member 6 has a fixing portion 3a of the heat resistor by means of caulking.

21 Claims, 11 Drawing Sheets

(a)

(b)

CERAMIC HEATERS

This application claims the benefit of Japanese Patent Application P-2002-73532 filed on Mar. 18, 2002, the entirety of which is incorporated by reference.

BACKGROUND OF THE INVENTION

1. Field of the Invention

The invention relates to a ceramic heater suitable in an application such as a system for producing semiconductors.

2. Related Art Statement

In a system for producing semiconductors, a ceramic heater may be provided for heating a wafer so as to deposit a semiconductor thin film on the wafer from gaseous raw materials such as silane gas by means of thermal CVD, plasma CVD or the like. In such a ceramic heater, it is required to make the temperatures on the mounting face and the semiconductor wafer mounted thereon uniform with high precision.

Several techniques for reducing the temperature distribution on the heating (mounting) face of such a ceramic heater are known. For example, a so-called two-zone heater is known. Such a two-zone heater includes a ceramic substrate and inner and outer resistance heat resistors made of a high melting point metal that are embedded in the substrate. Separate power supply terminals are connected to the respective heat resistors so that electric power may be applied independently on the respective resistors. Heat generated from the inner and outer heat resistors may be thus independently controlled.

Such a two-zone heater includes the following. Japanese patent publication 2001-102157A discloses a heater having a ceramic substrate and two layers of heating elements embedded in the substrate. The calorific values in the inner and outer zones of each heating element are controlled so that a two-zone control system of controlling inner and outer zones may be realized.

SUMMARY OF THE INVENTION

Depending on actual condition for setting a ceramic heater, it may be desired to control the calorific value from a heat resistor embedded in the heater. For example, when a heat resistor (winding) having a shape of a coil spring is embedded in a ceramic substrate, it is possible to increase the number of turns or winding diameter or to reduce the wire diameter, to increase the calorific value per an unit area on the wafer mounting surface. Further, it is possible to reduce the number of turns or winding diameter, or to increase the wire diameter, to reduce the calorific value per an unit area on the wafer mounting surface.

It is usually needed that a material of the heat resistor embedded in the ceramic substrate does not melt and does not easily deform at the firing temperature of the ceramic and is thus limited. For example, when a winding of molybdenum or tungsten wire is used, it is difficult to change the number of turns or winding diameter in a single winding due to the difficulty of production. It is thus necessary to mechanically and electrically connect a plurality of windings each having different winding diameters, wire diameters or numbers of turns in order to produce connected windings. The connected windings are then embedded in the ceramic substrate.

The inventors have tried to wind different kinds of windings having different winding diameters, numbers of turns or wire diameters to the cylindrical connecting member to electrically and mechanically connect them. Alternatively, they have tried to wind different kinds of non-wound wires having different wire diameters to the cylindrical connecting member to electrically and mechanically connect them. The windings or non-wound wires and the connecting member were embedded in a shaped body made of ceramic powder and the shaped body was then sintered at a high temperature under a high pressure. As a result, depending on the design, a hot spot may be observed near the connecting member connecting the windings. If such hot spots are observed on the mounting face, the desired uniformity of temperature may not be obtained, and the production yield may be reduced. Cracks may be observed, in some cases, due to the cylindrical connecting member to induce fracture of ceramics.

An object of the present invention is to provide a ceramic heater having a ceramic substrate, a heat resistor embedded in the substrate and a connecting member electrically connected with the end portion of the heat resistor, and to prevent hot spots near the end portion and fracture due to cracks caused by the connecting member.

The present invention provides a ceramic heater having a ceramic substrate with a mounting face for an object to be heated, a heat resistor embedded in the substrate and having an end portion, and a connecting member electrically connected with the end portion. At least one connecting member substantially has an outer shape of a sphere, an ellipsoid of revolution, or a cylinder, and the connecting member has a fixing portion fixing the end portion of the heat resistor by means of caulking.

The inventors have studied the cause of the hot spots near the end portion of the heat resistor described above, and reached the following discovery.

For example, when a winding is wound around a normal connecting member and the winding has a small wire diameter or a play is present near the end portion of the winding, it is considered that stress concentration on the connecting portion of the winding and connecting member may be avoided. However, when the winding has a large wire diameter (the winding is made of a thicker wire), the wire is hard to deform. It is thus difficult to wind the wire around the outer surface of the connecting member. Particularly, a high melting point metal such as molybdenum and tungsten is generally hard so it is difficult to obtain the proper shape.

After the wire is wound around the connecting member, irregularities and non-uniformity may be easily induced in the wire, or the play of the wire may be lost. After winding the wire to the connecting member, the wire and connecting member are subjected to a sintering process under a high pressure. Undue stress may be concentrated on the wire and connecting member with the flow of ceramic powder during the sintering process. Such undue stress may lead to local connecting defects and an actual calorific value may be larger than the designed calorific value so that hot spots may be generated. Further, for example when a non-wound wire is wound around the connecting member, it is proved that the above problems may occur depending on the wire diameter and material of the wire.

Based on the above discovery, the inventors have tried to provide a connecting member to be connected with a heat resistor in a ceramic substrate having a shape of a sphere, an ellipsoid of revolution or a cylinder. Additionally, a fixing portion is provided for fixing the end portion of the heat resistor by means of caulking.

Such a structure of the heat resistor in a ceramic substrate has the following advantages. That is, the outer shape of the connecting member does not have a sharp corner or characteristic point, so as to prevent undue stress on the connecting member or near during the sintering process of the ceramic substrate. It is thus possible to prevent cracks causing from the connecting member and hot spots on the mounding face due to such cracks. It is also possible to prevent irregularity or unevenness in the wire, or to provide an appropriate play after the wire is fixed to the connecting member, by fixing the end portion of the heat resistor by caulking. Such a ceramic shaped body having the connecting member and wire is sintered at a high temperature under a high pressure. During the sintering process, a stress is applied onto the wire and connecting member with the flow of powder. It is thus possible to prevent concentration of undue stress on the position of irregularity, unevenness or without a play during the sintering process. As a result, local connecting defects, the incidence of hot spots and fracture of the heater substrate may be reduced.

The connecting member according to the present invention includes the following.

(1) The connecting member is connected with two or more heat resistors and an electric supply member. In this case, the connecting member functions as a joint for a plurality of heat resistors to the resistor.

(2) The connecting member is connected with one or a plurality of heat resistors and an electric supply means. In this case, the connecting member functions as a terminal for supplying electric power.

These and other objects, features and advantages of the invention will be appreciated upon reading the following description of the invention when taken in conjunction with the attached drawings, with the understanding that some modifications, variations and changes of the same could be made by the skilled person in the art.

DETAILED DESCRIPTION OF THE INVENTION

The present invention will be described further in detail, referring to the attached drawings.

FIG. 1(a) is a plan view showing a connecting member 6 having a spherical shape according to one embodiment of the present invention, and FIG. 1(b) is a front view showing the connecting member 6. FIG. 1(c) is a plan view showing the connecting member 6 after the end portion of a heat resistor is fixed in a groove 6a of the member 6. FIG. 2(a) is a cross sectional view showing a connecting member 5 connected with a non-wound wire 4 and windings 3A (3B), and FIG. 2(b) is a plan view showing the connecting member 5 in another embodiment of the present invention.

Figure 1:
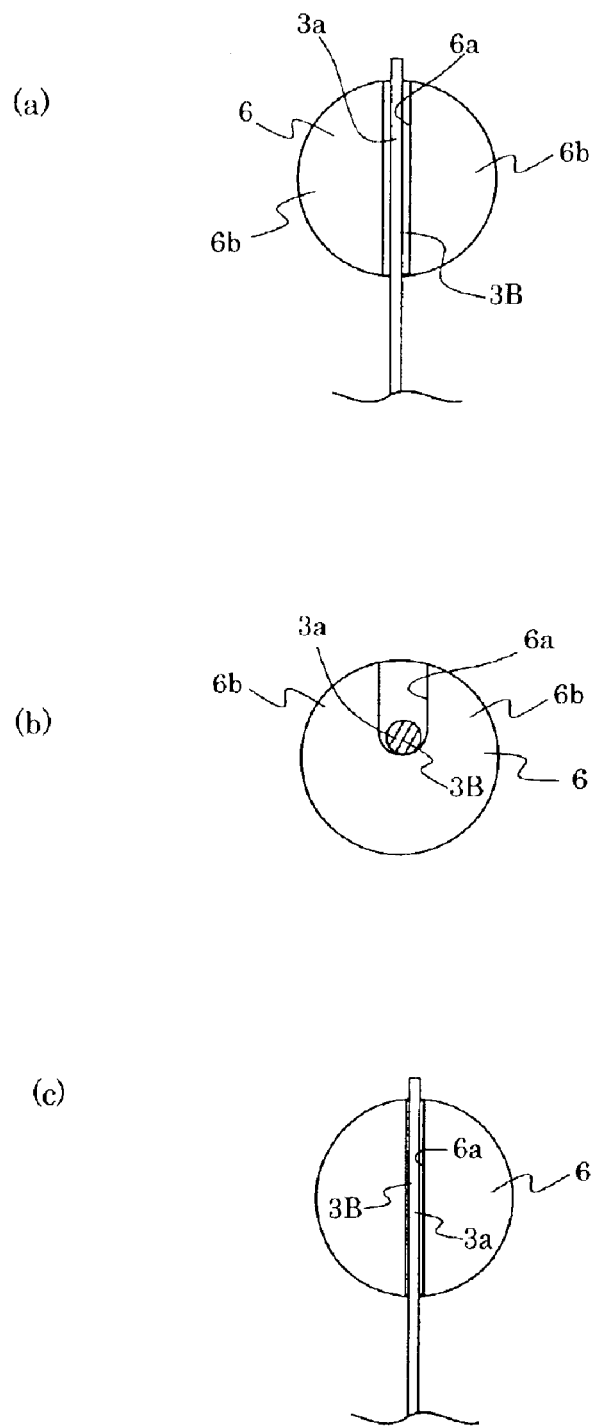
FIG. 1(a) is a plan view showing a connecting member 6.
FIG. 1(b) is a front view showing a connecting member 6.
FIG. 1(c) is a plan view showing a connecting member 6 after caulking.

As shown in FIG. 1, the connecting member 6 has a shape of a sphere and an elongate groove 6a formed therein. A pair of caulking pieces 6b are formed in the both sides of the groove 6a. An end portion 3a of a heat resistor 3B is inserted into the groove 6a and the caulking pieces 6b are deformed by applying a pressure to fix the end portion 3a by caulking. In the present example, the elongate groove 6a functions as a fixing part of a heat resistor.

Figure 2:
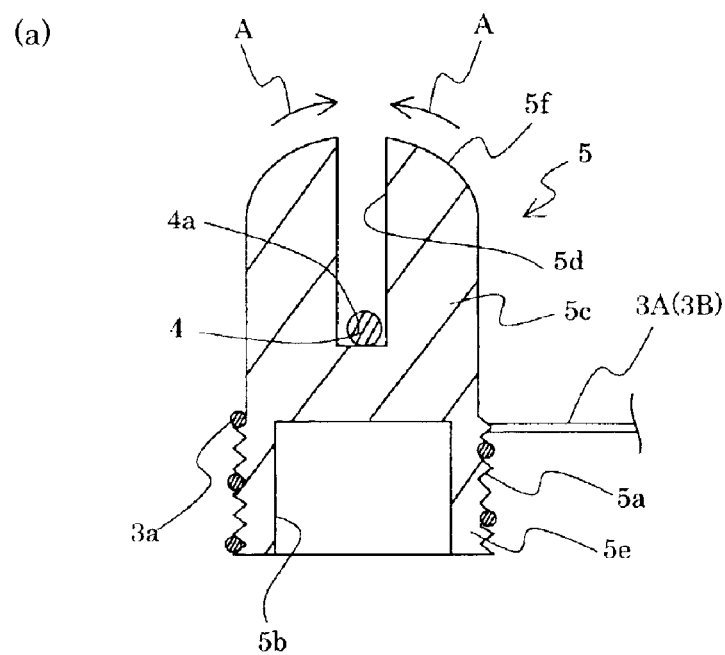
FIG. 2(a) is a cross sectional view showing a connecting member 5 connected with a non-wound wire 4 and windings 3A (3B).
FIG. 2(b) is a plan view showing the connecting member 5.
Figure 2:
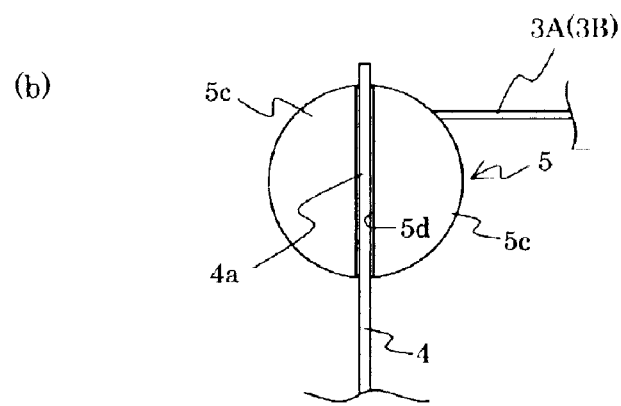

A connecting member 5 shown in FIG. 2 substantially has a shape of a cylinder. The connecting member 5 has an elongate groove 5d and a pair of caulking pieces 5c on the both sides of the groove 5d. An end portion 4a of a non-wound wire (heat resistor) 4 is inserted into the groove 5d and the caulking pieces 5c are deformed as an arrow "A" by applying a pressure to fix the end portion 4a by caulking. In the present example, the elongate groove 5d functions as a fixing part of the heat resistor. Further, a tubular portion 5e is provided in the lower part of the connecting member 5. A screw 5a is formed outside of the tubular portion 5e so that a space 5b is formed inside of the tubular portion 5e. The end portions 3a of the heat resistors 3A and 3B are wound around and fixed to the screw 5a. The planar patterns of the connecting members 5, 6 and heat resistors 3A, 3B and 4 will be described in more detail below.

In the present invention, the kind of object to be heated is not limited. The application of the heater according to the present invention is not limited, and may preferably be used for a system for producing semiconductors. Such a semiconductor producing system means a system that is usable in a wide variety of semiconductor processing in which metal contamination of a semiconductor is to be avoided. Such systems include film forming, etching, cleaning and testing systems.

The ceramic material for the plate-shaped substrate for the heater is not particularly limited. The material for the substrate may be a known ceramic material including nitride ceramics such as aluminum nitride, silicon nitride, boron nitride and sialon, and an alumina-silicon carbide composite material. Aluminum nitride or alumina is most preferred for providing an excellent anti-corrosion property against a corrosive gas such as a halogen based corrosive gas.

The shape of the substrate is not particularly limited and may preferably be disk shaped. Pocket shaped parts, emboss-shaped parts, or grooves may be formed on the semiconductor mounting face.

In a preferred embodiment, the heat resistor is embedded along a specified plane. In this embodiment, it is required that the specified plane passes through at least a part of the heat resistor. It is not required that the geometrical center of the heat resistor is on the specified plane in a geometrically strict meaning. In addition to this, the central plane of the heat resistor may be dislocated from the specified plane due to any reasons including manufacturing error, allowance or tolerance.

In a preferred embodiment, the heat resistor is provided so that the heat resistor is substantially parallel with the mounting face of the heater substrate. It is thus possible to further improve the uniformity of temperature on the mounting face. In this embodiment, the resistor may be parallel with the mounting face in a geometrically strict meaning. Alternatively, the resistor may be arranged to intersect the semiconductor mounting face at a sufficiently small angle such as −0.5 to +0.5 degree. Furthermore, a tolerance in the manufacturing process may be allowed.

According to the present invention, the connecting member has a shape of a sphere, an ellipsoid of revolution or a cylinder. Such an outer shape of the connecting member does not have a sharp corner or characteristic point, so as to prevent undue stress on the connecting member during the sintering process of the ceramic substrate. Additionally, when the connecting member is made of a metal having a high melting point, the connecting members having the above outer shapes may be easily produced with improved processing precision. It is thus possible to prevent dimension errors in the manufactured connecting members and to prevent concentration of stress due to the error.

The connecting member may substantially have a shape of a sphere. The shape includes a rotated circle (sphere), and a shape which may be deemed substantially the same as a sphere. It is not required that the outer shape is a sphere in a geometrically strict meaning and manufacturing error, allowance or tolerance may be allowed. Further, a local recess or protrusion may be present in the connecting member as long as the recess or protrusion does not have dimensions leading to a concentration of undue stress.

The connecting member may substantially have a shape of an ellipsoid of revolution. The shape includes a rotated ellipsoid, and a shape which may be deemed substantially the same as a rotated ellipsoid. It is not required that the outer shape is an ellipsoid of revolution in a geometrically strict meaning and manufacturing error, allowance or tolerance may be allowed. Further, a local recess or protrusion may be present in the connecting member as long as the recess or protrusion does not have dimensions leading to a concentration of undue stress.

The connecting member may also substantially have a shape of a cylinder. The shape includes a cylinder, and a shape which may be deemed substantially the same as a cylinder. It is not required that the outer shape is a cylinder in a geometrically strict meaning and manufacturing error, allowance or tolerance may be allowed. Further, a local recess or protrusion may be present in the connecting member as long as the recess or protrusion does not have dimensions leading to a concentration of undue stress.

A chamfered part, such as so-called "R" or "C" face, may be provided on the surface of the connecting member substantially having an outer shape of a sphere, an ellipsoid of revolution or a cylinder. For example, in FIG. 2(a), an R face 5f is formed on the surface of the connecting members having an outer shape of a cylinder.

According to the present invention, the end portion of the heat resistor is fixed by caulking. That is, a pair of caulking pieces are pressed and deformed so that the end portion of the heat resistor is mechanically clamped with the deformed caulking pieces and fixed therebetween.

The geometrical shape and dimensions of the caulking pieces are not particularly limited. Further, the shape of the fixing portion may preferably be a groove elongating straightforwardly in a plan view as shown in FIGS. 1(c) and 2(b). The fixing portion may, however, be a groove that is bent or curved two-dimensionally in a plan view or a groove that is bent or curved three-dimensionally.

In an embodiment where the outer shape of the connecting member is substantially a sphere or an ellipsoid of revolution, it is possible to reduce the thickness of the substrate when the connecting member is embedded in the substrate. The embodiment is preferred for reducing the thickness of a plate-shaped substrate.

Further, it is preferred that the connecting member substantially has a shape of a cylinder, for winding the end portion of the wire, preferably the winding, around the connecting member. In this case, another heat resistor separate from the wire is fixed to the connecting member by caulking.

The material for the heat resistor is preferably tantalum, tungsten, molybdenum, platinum, rhenium, hafnium or the alloys of these metals. In particular, when the ceramic substrate is made of aluminum nitride, the material of the heat resistor is preferably pure molybdenum or an alloy containing molybdenum. The material of the heat resistor may be a conductive material such as carbon, TiN or TiC, in addition to the high melting point metals described above.

The material of the connecting member is preferably the material for the heat resistor described above. It is particularly preferable that the material of the heat resistor is substantially same as that of the connecting member. It is thus possible to further reduce the concentration of stress at the joining portion of the connecting member and heat resistor during the sintering process.

In the present embodiment, the material of the heat resistor is the same as that of the connecting member. In this embodiment, it is not required that the added or trace components are identical, as long as the main components are the same. Preferably, at least 50 weight percent, more preferably, at least 70 weight percent, of the material of the heat resistor is the same as that of the connecting member. More preferably, the materials of the connecting member and heat resistor are tungsten, molybdenum, the alloy of tungsten or the alloy of molybdenum.

The shape of the heat resistor may be a coil winding, ribbon, mesh, plate, film or non-wound wire. The shape of the heat resistor is preferably a winding to prevent temperature reduction in the direction of the thickness of the ceramic substrate and to facilitate control of the temperature distribution on the mounting face.

The diameter of the wire winding may be decided depending on the required supply of calorific value, winding coil diameter, thermal conductivity and shape of the substrate. Generally, the wire diameter is preferably 0.1 to 1.5 mm. The diameter of the non-wound wire is preferably not smaller than 0.3 mm to facilitate the connection of the wire to the connecting member. Further, the diameter of the non-wound wire is preferably not larger than 1.0 mm to supply energy of a reasonable calorific value through the non-wound wire and to reduce cold spots.

In a preferred embodiment, a plurality of heat resistors are embedded in the substrate and connected with each other through the connecting member. The present invention is particularly preferred as a structure for connecting the heat resistors in the substrate.

In a preferred embodiment, the heat resistors have shapes and/or dimensions that are different from each other.

In a preferred embodiment, a plurality of heat resistors are composed of conductive wires, respectively, and have wire diameters that are different from each other. In this case, it is preferred to connect a heat resistor having a larger wire diameter to a connecting member by caulking.

In a preferred embodiment, a plurality of heat resistors are composed of windings that have different winding diameters from each other. The embodiment will be further described below, referring to the attached drawings.

In a preferred embodiment, the electrical resistance at room temperature of the connecting member is not larger than 1/10 of that of the heat resistor connected to the connecting member. It is thus possible to prevent excessive heat generation in the connecting member and to reduce the adverse effects on the temperature distribution on the mounting face.

In a preferred embodiment, the substrate is composed of a plate having a thickness of not smaller than 3 mm and not larger than 25 mm. If the thickness is smaller than 3 mm, a space between the heat resistor and mounting face is small. It is thus difficult to reduce the temperature distribution on the mounting face. If the thickness is larger than 25 mm, the thermal capacity of the ceramic heater is increased so that a longer response time is required for controlling the temperature on the mounting face.

The shape of the fixing portion of the connecting member is not particularly limited, as long as the caulking of the heat resistor is possible. In a preferred embodiment, the fixing portion is composed of a groove, more preferably an elongate groove, into which the end portion of the heat resistor may be inserted.

Figure 3:
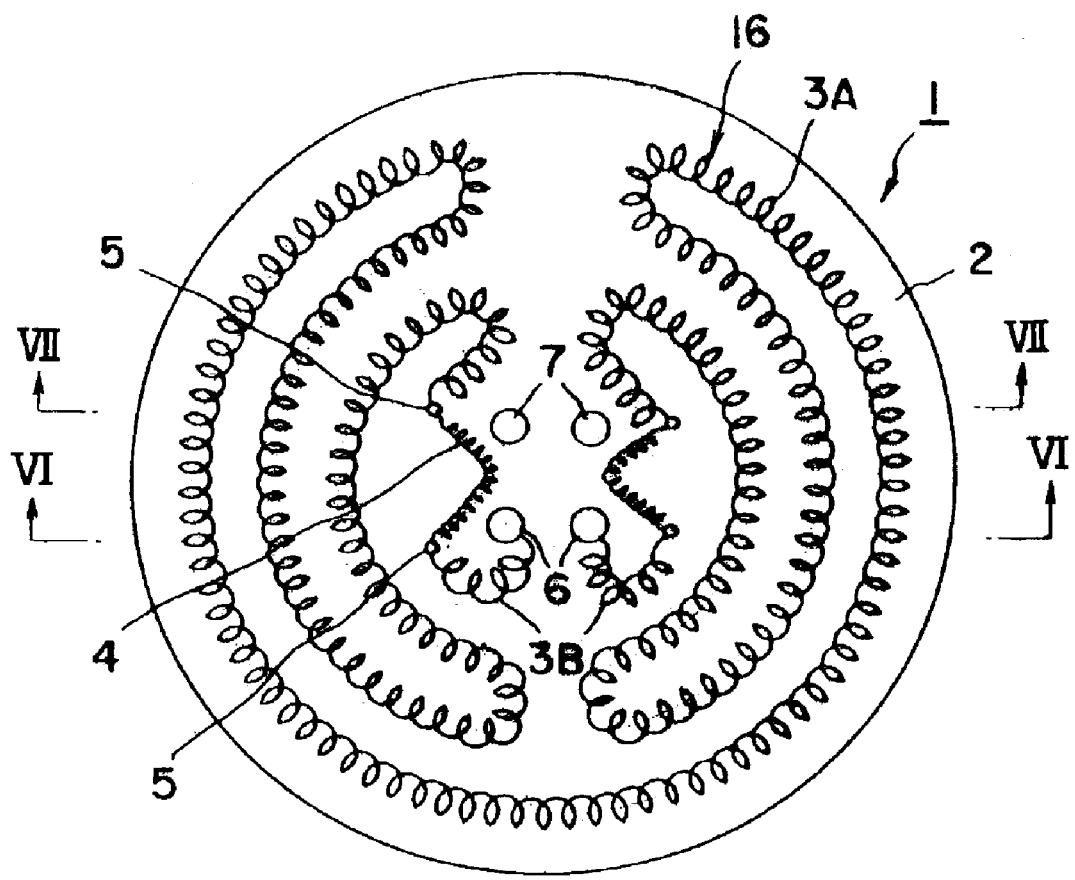
FIG. 3 is a plan view showing planar pattern of a heat resistor 16 embedded in a ceramic heater 1 according to one embodiment of the present invention.
Figure 4:
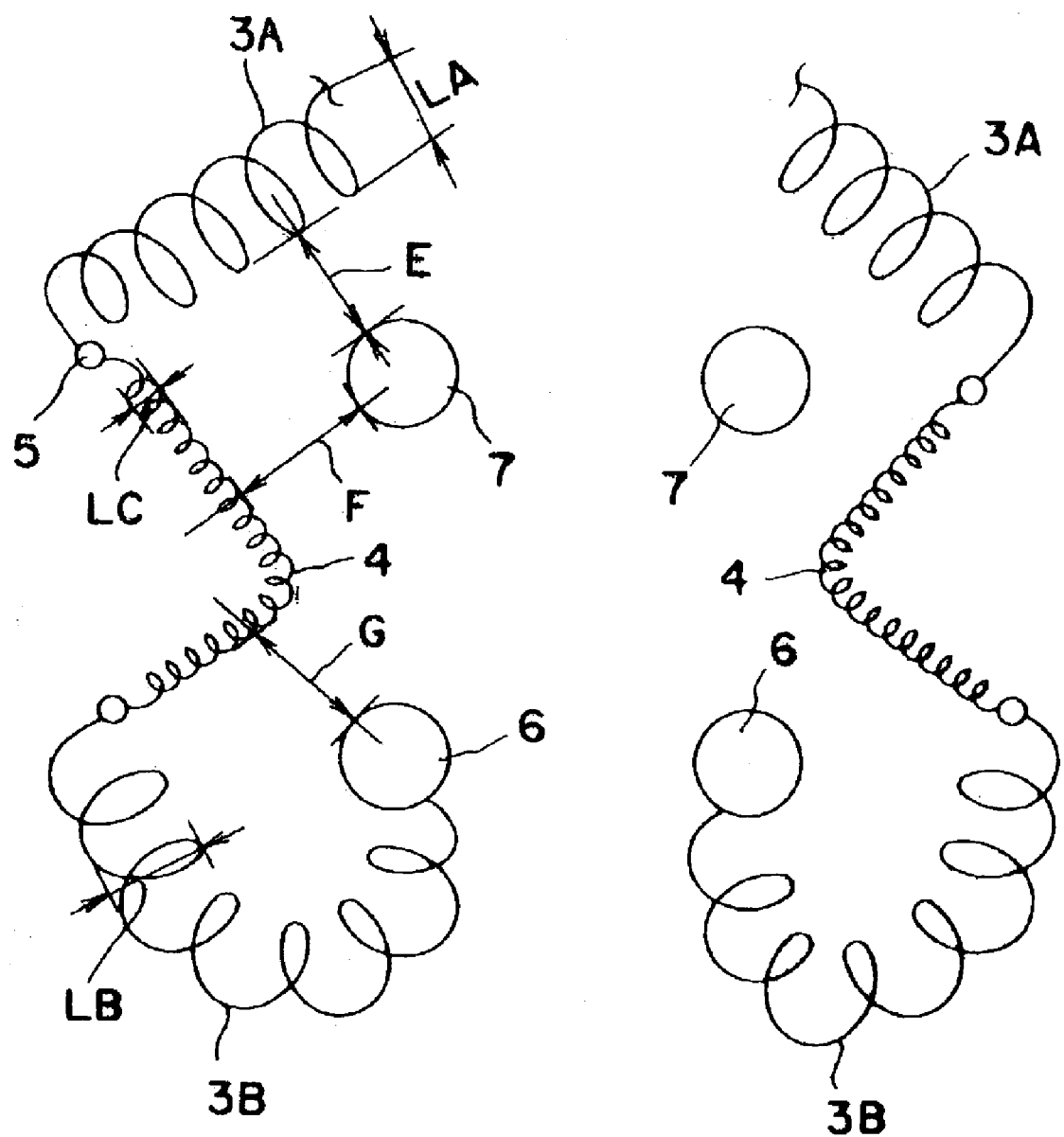
FIG. 4 is an enlarged view showing the essential part of FIG. 3.
Figure 6:
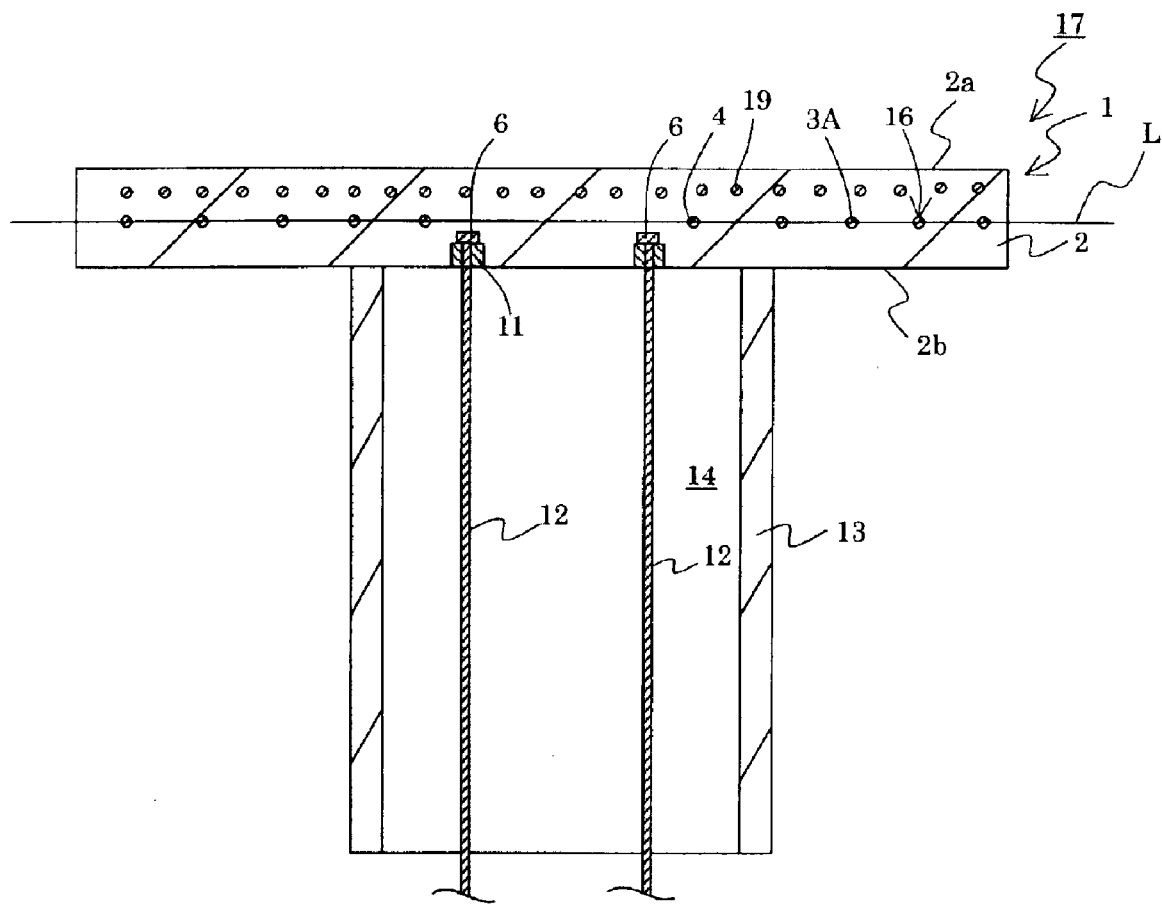
FIG. 6 is a cross sectional view showing a heating system 17 having a heater 1 of FIG. 3 and a supporting member 13 (correspond to a cross section cut along a VI—VI line in FIG. 3).
Figure 7:
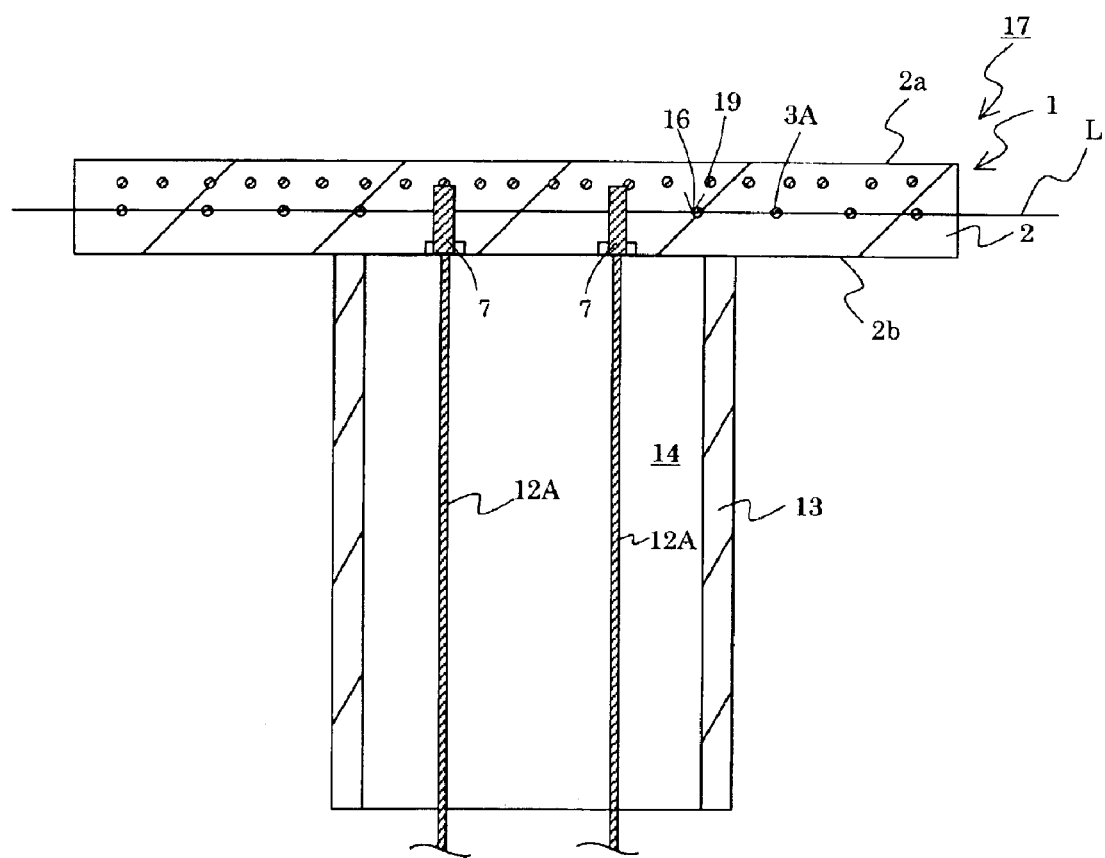
FIG. 7 is a cross sectional view showing a heating system 17 having a heater 1 of FIG. 3 and a supporting member 13 (correspond to a cross section cut along a VII—VII line in FIG. 3).

Examples of the whole constructions of ceramic heaters according to the present invention are depicted in the attached figures. FIG. 3 is a diagram showing a planar pattern of a heat resistor 16 embedded in a substrate 2 in a ceramic heater 1 according to one embodiment of the present invention. FIG. 4 is an enlarged view of essential parts in FIG. 3, and FIGS. 6 and 7 show a heating system 17 having the ceramic heater 1 and supporting member 13. In the ceramic heater 1, the heat resistor is embedded in the substrate 2 and not exposed to the surface of the substrate. In FIG. 3, however, hatching of cross section is omitted for clearly showing the planar pattern of the heat resistor embedded in the substrate.

The heating system of the present example will be described referring to FIGS. 6 and 7. The substrate 2 substantially has a shape of a disk. Windings 3A, 4, 3B and a functional member 9 are embedded in the substrate 2. As shown in FIG. 6, the heat resistor 3B is connected with an electric supply means 12 through connecting members 6 and 11. The connecting member 6 functions as a terminal for supplying power. As shown in FIG. 7, a functional member 19 is connected with an electric supply means 12A through a connecting member 7. The functional member 19 is, for example, an electrode for an electrostatic chuck.

A hollow supporting member 13 has an end face joined with a back face 2b of the substrate 2. The joining method is not particularly limited. The joining may be carried out by soldering or solid phase welding as described in Japanese patent publication P8-73280A. The heater and supporting member may be joined and sealed using a sealing member such as an O-ring and a metal packing. The supporting member 13 has a cylindrical shape. The supporting member 13 defines an inner space 14 separated from atmosphere in a chamber. The power supply means 12 and 12A are contained in the inner space 14.

A first winding 3A is embedded according to planar pattern substantially of a spiral. Both ends of the wire 3A are respectively connected with a second winding 4 through a connecting member 5. The other end of each winding 4 is connected with the first winding 3B. The other end of each winding 3B is connected with the connecting member 6.

As shown in FIG. 4, the first windings 3A and 3B have winding diameters (i.e., coil diameters) LA, LB, respectively, that are larger than the winding diameter LC of the second winding 4. The advantages are as follows.

Figure 8:
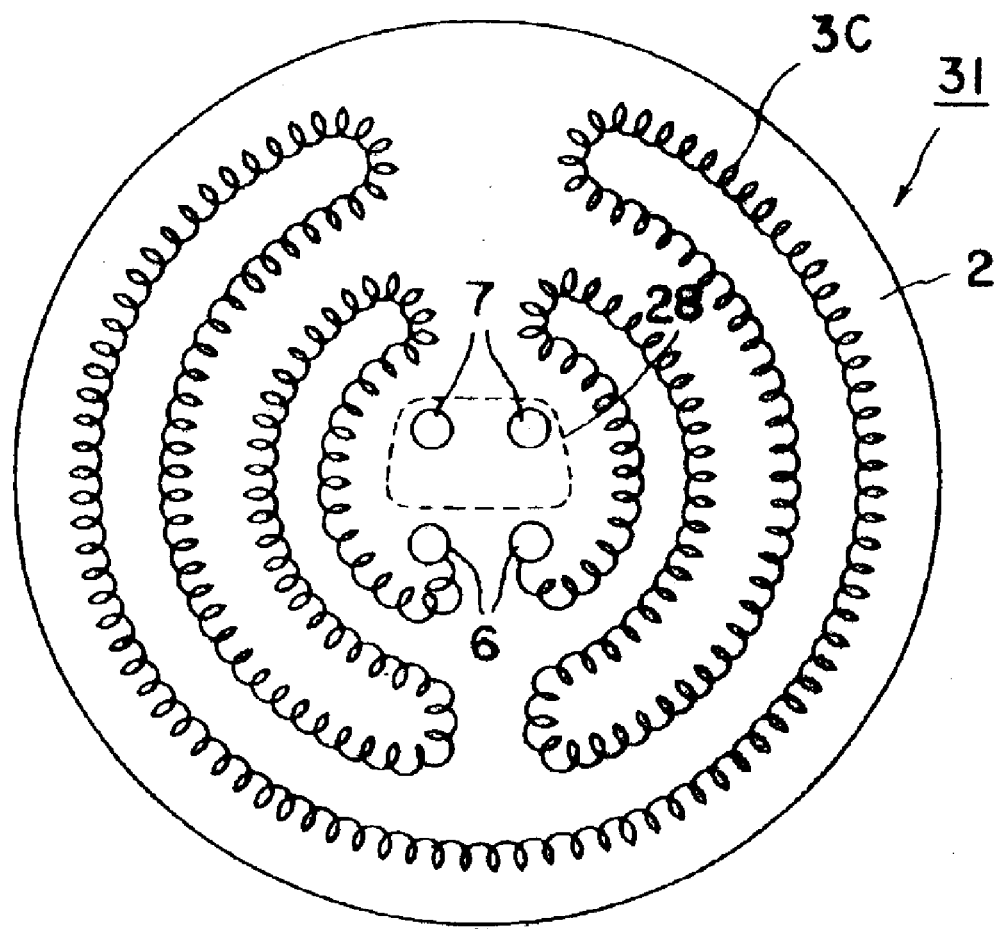
FIG. 8 is a plan view showing planar pattern of a heat resistor embedded in a ceramic heater 31 according to a reference example.
Figure 9:
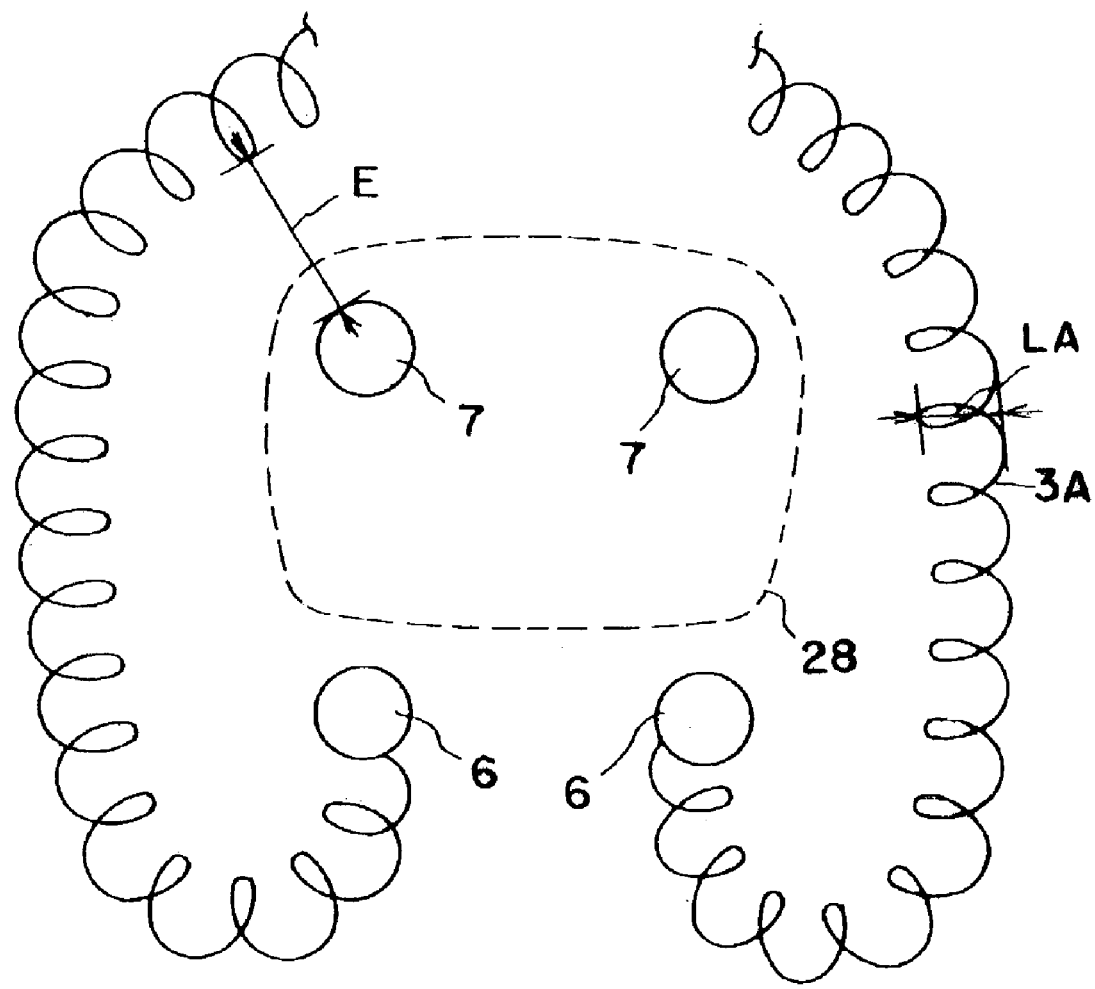
FIG. 9 is an enlarged view showing essential parts of FIG. 8.

For example, in a ceramic heater 31 shown in FIGS. 8 and 9, a winding 3C having a shape of a coil spring is embedded in a ceramic substrate 2. Both ends of the winding 3C are connected with the connecting members 6, respectively. Such a heat resistor having a shape of a coil spring has a relatively large diameter (that is, the winding diameter of the coil spring). It is thus possible to reduce the temperature change (temperature reduction) in the thickness direction of the substrate 2, compared with a heater using a heat resistor composed of a non-wound wire. Such a property is advantageous for improving the temperature uniformity on the heating face of the substrate 2.

When such a heat resistor having a shape of a coil spring is embedded in a substrate to improve the temperature uniformity on the heating face, however, cold spots may be observed due to the heat resistor. Such cold spots may be induced for the following reasons. The heat resistor (coil spring) cannot be embedded on or near a functional member or holes in the substrate. It is necessary to provide a safe distance between the hole and heat resistor, considering the dimensional tolerances of processes of machining the hole and embedding the heat resistor in the substrate. Further, it is necessary to assure insulation between the functional member and heat resistor for preventing short-cut. The insulation is decided by the distance between the functional member and heat resistor, shapes of the functional member and heat resistor, and the volume resistivity of the ceramic. It is thereby necessary to provide a safe distance between the functional member and the heat resistor in the substrate. When such a safe distance is provided between the functional member and heat resistor, however, cold spots may be observed depending on the design.

For example, in the example shown in FIG. 8, a pair of functional members 7 such as connecting members for an electrode for electrostatic chuck are positioned at as small distance. Further, in the present example, a pair of connecting members 6 for a heater are positioned at a small distance. Such a design is applied to join a tube shaped supporting member to the central part of the back face of a heater and insert a power supply member inside the supporting member. In this case, it is required that the connecting members 6, 7 are positioned in a central part of the substrate 2. When a pair of connecting members 6 and a pair of the connecting members 7 are positioned in a relatively small central part at small distances, however, it becomes difficult to embed the heat resistor near the connecting members 7, because the distance of the connecting members 7 is too small to assure a sufficiently large space for inserting the heat resistor therebetween. It is also difficult to assure a sufficient space between each connecting member 6 and the adjacent connecting member 7 for inserting the heat resistor. As a result, cold spots may be observed between the connecting members 7 and the surrounding region 28.

On the contrary, in the present example as shown in FIG. 4, the winding 4 having a smaller winding diameter LC may be provided near a functional defect, such as the connecting member 7. Since the winding diameter LC of the winding 4 is small, the winding 4 may be bent or curved in the substrate so that safety distances F and G may be assured and the distance of the winding 4 and the connecting member 7 and that of the winding 4 and connecting member 6 are minimized. When the winding 4 has a large winding diameter, it is difficult to bend or deform the winding 4 so that the distance of the winding 4 and connecting member 6 and that of the winding 4 and connecting member 7 are made small. As a result, it is possible to prevent, or at least reduce, the cold spots 28 (see FIG. 8) on the heating face.

Figure 5:
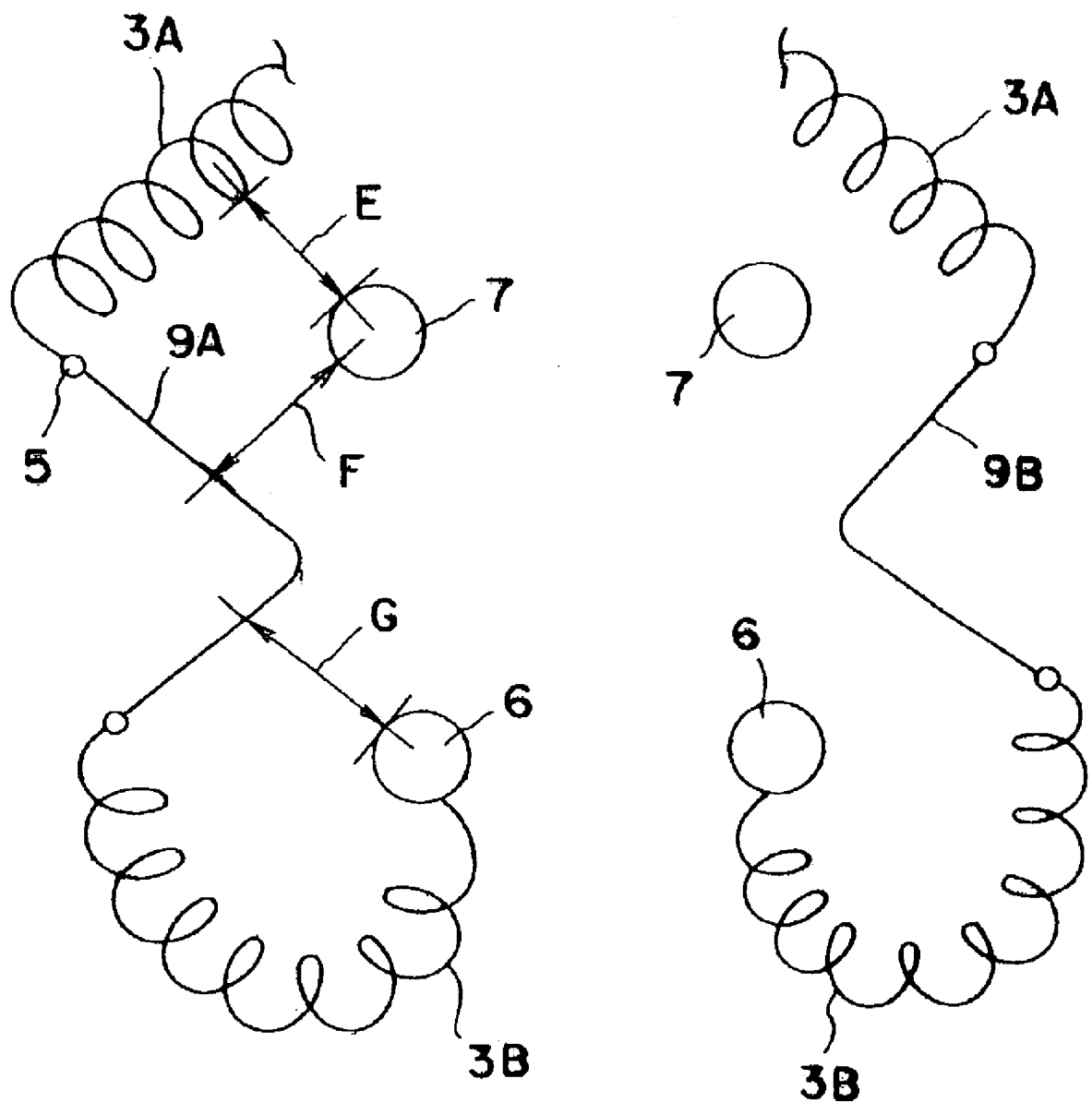
FIG. 5 is a plan view showing planar pattern of a heat resistor according to another embodiment of the present invention.

In the embodiment shown in FIG. 5, non-wound wires 9A and 9B are used each composed of a wire of a conductive material, instead of the second winding having a smaller winding diameter. Also in this case, the distances F and G between the non-wound wires 9A, 9B and the connecting members 6, 7 may be minimized assuring safety distances at the same time.

When the winding diameter of the first winding is larger, a thicker ceramic substrate is needed for embedding the winding so that the thermal capacity of the heater is increased. The winding diameter of the first winding is preferably not smaller than 5 m for reducing the thermal capacity of the ceramic heater. The winding diameter "LC" of the second winding is preferably not larger than 5 mm, and more preferably, not larger than 3 mm from this viewpoint. The lower limit of the winding diameter LC of the second winding is not particularly defined, and is preferably 2 mm or more to facilitate mass production.

In a preferred embodiment, as shown in FIGS. 3 to 5, the substrate has a structural defect 7. Such a structural defect means a part in the substrate in which an object that is different from the ceramic constituting the substrate, a space or hollow is provided. Such objects include a ceramic that is different from the ceramics constituting the substrate, metals (including alloys) and composite materials of a metal and ceramic. More specifically, such objects include a connecting member, a conductive connection part, an electrode for generating high frequency, an electrode for electrostatic chuck and a thermocouple. The space or hollow includes holes for inserting a lift pin and holes for supplying back side gas.

The distances F and G between the second winding and non-wound wire or structural defect are preferably not larger than 40 mm, and more preferably, not larger than 15 mm, for reducing the cold spots. When the distance between the second winding or non-wound wire and structural defect are too small, the insulating property is reduced or the tolerance of design might not be assured. Each of the distances F and G between the second winding or non-wound wire and structural defect are preferably not smaller than 2 mm from this viewpoint.

The first winding and second winding or non-wound wire are connected through the connecting member according to the present invention. Preferably, the second winding or non-wound wire is fixed to the connecting member by means of caulking according to the present invention. In this embodiment, the first winding and connecting member are joined by means of a method not particularly limited including winding to a screw, caulking, fitting, soldering, welding or eutectic welding.

Each heat resistor does not necessarily have planar pattern composed of one continuous line without branching or coupling between the corresponding connecting members. Each heat resistor may have an electrical branching part or coupling part between the connecting members.

Figure 10:
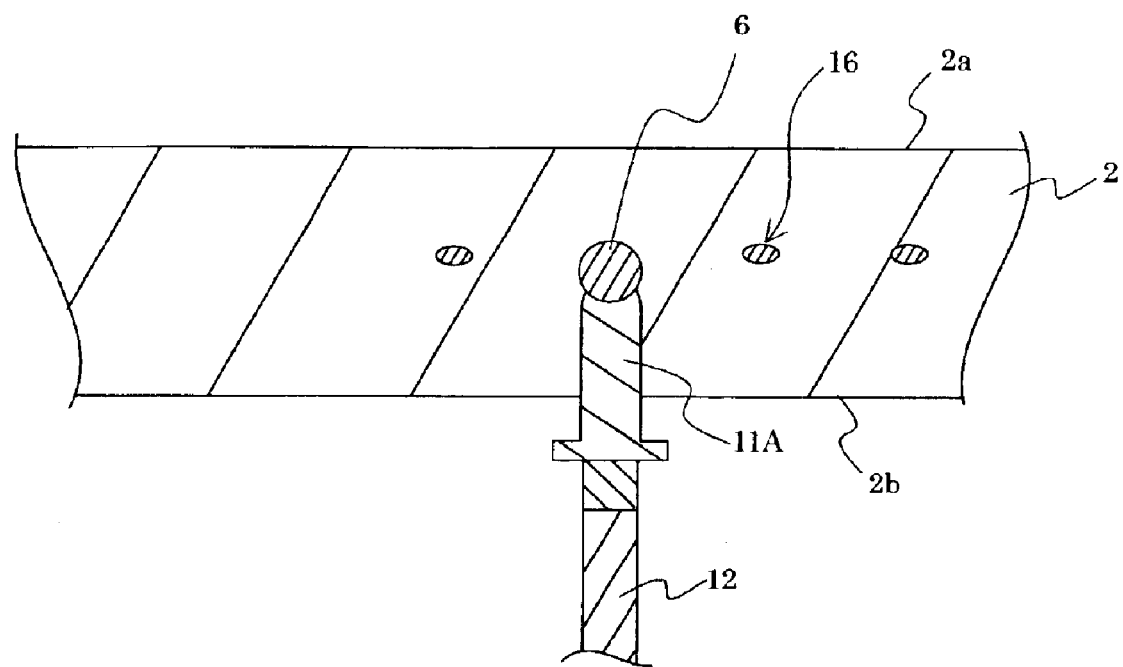
FIG. 10 shows a connecting structure of connecting members 6, 11A and an electric supply means 12.

FIG. 10 is a cross sectional view showing a connecting structure of the connecting member 6 and electric supply means 12. In the present example, a rod-shaped connecting member 11A is inserted and fixed in the substrate 2. The connecting member 11A and connecting member 6 may be connected by a method not particularly limited.

Figure 11:
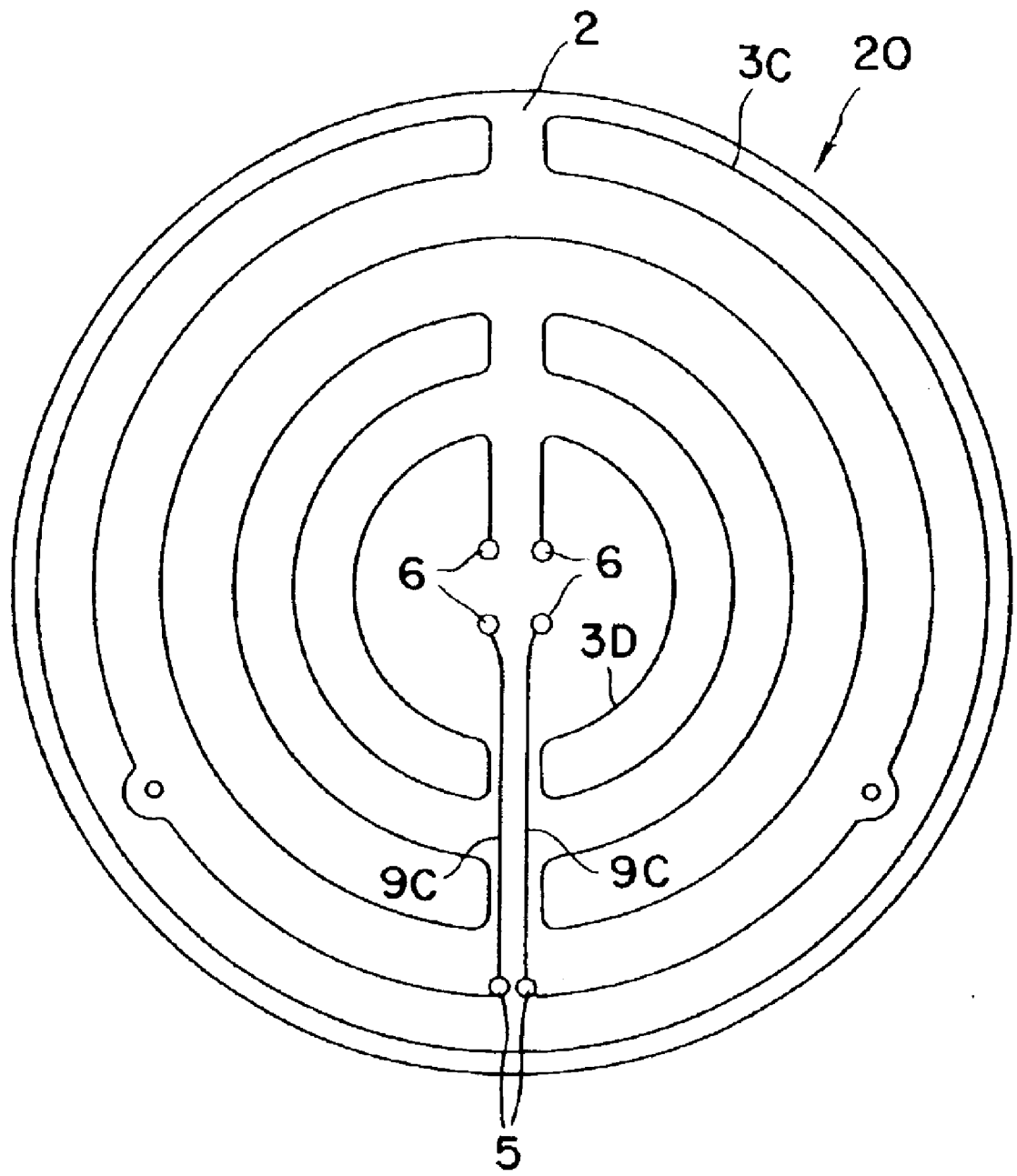
FIG. 11 shows a pattern of an embedded heat resistor according to another embodiment of the present invention.

FIG. 11 shows planar pattern of the embedded heat resistor according to another embodiment of the present invention. In the present embodiment, a so-called two-zone heater pattern is applied. Both ends of the inner heat resistor 3D are respectively connected with a connecting member 6 in the central part of the substrate 2. The heat resistor 3D is preferably composed of the winding or mesh described above. Both ends of the outer heat resistor 3C are respectively connected with connecting members 5. Preferably, the heat resistor 3C is composed of a winding or mesh and both ends of the heat resistor 3C are wound around the outer surface of the connecting member 5. One end of each non-wound wire 9C is connected to a respective connecting member 5 by caulking and the other end of each non-wound wire 9C is connected with a respective connecting member 6. The connecting member 5 functions as a kind of joint for connecting the heat resistors. The connecting member 6 is connected with an outer electric supply means, for example through the connecting member shown in FIG. 10.

EXAMPLES

Example 1

The ceramic heater 20 shown in FIGS. 10 and 11 was produced. The substrate 2 was made of an aluminum nitride sintered body having a diameter $^{SM}$ of 350 mm and a thickness of 20 mm. The windings 3C and 3D and non-wound wire 9C were embedded in the substrate 2. The windings 3C, 3D had winding diameters LA and LB of 3.0 mm and a wire diameter of 0.5 mm. The winding wire 9C had a wire diameter of 1.0 mm. The distances between the heat resistors 3C, 3D, 9C and mounting face were 9 mm.

The connecting member 5 was composed of a cylindrical connecting member (caulking member) made of molybdenum metal as shown in FIG. 2. The end of the winding 3C was wound around the outer surface of the connecting member 5. Further, the end of the non-wound wire 9C was fixed to the connecting member 5 by caulking. The connecting member 6 was composed of a spherical connecting member as shown in FIG. 1. The end portion of the winding 3D or non-wound wire 9C is fixed to the connecting member 6.

The supporting member 13 shown in FIGS. 6 and 7 was joined with the back face of the substrate 2. The supporting member 13 was composed of an aluminum nitride sintered body. The supporting member 13 had an outer diameter of 80 mm, an inner diameter of 50 mm, and a length of 250 mm. The supporting member 13 was joined with the back face of the central part of the substrate 2 by means of solid phase welding. The electrical supply means 12 composed of a nickel rod was inserted into the inner space 14 of the supporting member 13 and electrically connected with each of the connecting members 6 through the connecting member 11A.

The temperature of the ceramic heater was elevated so that the average temperature on the mounting face 2a was about 700° C. The temperature distribution on the mounting face 2a was observed by a thermoviewer. The difference between the maximum and minimum temperatures measured on the mounting face was 4.0° C.

Example 2

A two-zone heater was produced according to the same procedure as Example 1. The non-wound wire 9C and connecting member 5 were not used, however, and each end of the windings 3C and 3D was connected with each connecting member 6. The windings 3C and 3D had winding diameters LA and LB of 3.0 mm and a wire diameter of 0.3 mm. The windings 3C and 3D were embedded according to planar pattern of a conventional dual zone heater. Further, the substrate 2 had a diameter of 330 mm and a thickness of 5 mm. The distance between the heat resistors 3C, 3D and mounting face was 2.5 mm. The connecting member 6 was composed of a spherical connecting member shown in FIG. 1. The ends of the windings 3C and 3D were fixed to the connecting member 6 by caulking.

The temperature of the ceramic heater was elevated so that the average temperature on the mounting face 2a was about 200° C. The temperature distribution on the mounting face 2a was observed by a thermoviewer. The difference between the maximum and minimum temperatures measured on the mounting face was 0.5° C.

As described above, the present invention provides a structure that is effective for improving the temperature uniformity on the heating face of a heater and preventing the cold spots on the heating face.

The present invention has been explained referring to the preferred embodiments. However, the present invention is not limited to the illustrated embodiments which are given by way of examples only, and may be carried out in various modes without departing from the scope of the invention.

What is claimed is:

1. A ceramic heater comprising a ceramic substrate having a mounting face for an object to be heated, a heat resistor embedded in said substrate, said heat resistor having an end portion, and at least one connecting member electrically connected with said end portion of said heat resistor;

wherein at least a portion of said at least one connecting member has an outer shape substantially corresponding to a 3-dimensional outer shape of a sphere or an ellipsoid of revolution, and wherein said at least one connecting member has a fixing portion fixed to said end portion of said heat resistor by means of caulking.

2. The ceramic heater of claim 1, wherein a plurality of said heat resistors are embedded in said substrate, and at least two of said heat resistors are connected with each other through said at least one connecting member.

3. The ceramic heater of claim 2, wherein said at least two heat resistors have different shapes with respect to each other.

4. The ceramic heater of claim 1, wherein said at least one connecting member and said heat resistor connected with said at least one connecting member are made of the same kind of material.

5. The ceramic heater of claim 1, wherein said at least one connecting member has an electrical resistance at room temperature that is not larger than 1/10 of that of said heat resistor.

6. The ceramic heater of claim 1, wherein said substrate comprises a plate having a thickness of at least 3 mm and not more than 25 mm.

7. The ceramic heater of claim 1, wherein said heat resistor is embedded in said substrate along a plane that is substantially parallel with said mounting face of said substrate.

8. The ceramic heater of claim 1, wherein said fixing portion comprises a groove or hole for inserting said end portion of said heat resistor.

9. The ceramic heater of claim 1, wherein said heat resistor comprises at least one of a mesh, a wire and a winding.

10. A ceramic heater comprising a ceramic substrate having a mounting face for an object to be heated, a heat resistor embedded in said substrate, said heat resistor having an end portion, and at least one connecting member electrically connected with said end portion of said heat resistor;

wherein at least a portion of said at least one connecting member has an outer shape substantially corresponding to that of a sphere or an ellipsoid of revolution, and wherein said at least one connecting member has a fixing portion fixed to said end portion of said heat resistor by means of caulking;

wherein a plurality of said heat resistors are embedded in said substrate, and at least two of said heat resistors having different shapes with respect to each other are connected with each other through said at least one connecting member; and wherein said at least two heat resistors comprise conductive wires having different wire diameters with respect to each other.

11. A ceramic heater comprising a ceramic substrate having a mounting face for an object to be heated, a heat resistor embedded in said substrate, said heat resistor having an end portion, and at least one connecting member electrically connected with said end portion of said heat resistor;

wherein at least a portion of said at least one connecting member has an outer shape substantially corresponding to that of a sphere or an ellipsoid of revolution, and wherein said at least one connecting member has a fixing portion fixed to said end portion of said heat resistor by means of caulking;

wherein a plurality of said heat resistors are embedded in said substrate, and at least two of said heat resistors having different shapes with respect to each other are connected with each other through said at least one connecting member; and wherein said at least two heat resistors comprise windings having different coil diameters with respect to each other.

12. A ceramic heater comprising a ceramic substrate having a mounting face for an object to be heated, a heat resistor embedded in said substrate, said heat resistor having an end portion, and at least one connecting member electrically connected with said end portion of said heat resistor;

wherein at least a portion of said at least one connecting member has a substantially cylindrical outer shape, said portion comprising a pair of opposed caulking pieces arranged to define said substantially cylindrical outer shape, said pair of caulking pieces being spaced apart from one another by an elongate groove formed between said caulking pieces, said elongate groove fixing said end portion of said heat resistor by caulking.

13. The ceramic heater of claim 12, wherein a plurality of said heat resistors are embedded in said substrate, and at least two of said heat resistors are connected with each other through said at least one connecting member.

14. The ceramic heater of claim 13, wherein said at least two heat resistors have different shapes with respect to each other.

15. The ceramic heater of claim 12, wherein said at least one connecting member and said heat resistor connected with said at least one connecting member are made of the same kind of material.

16. The ceramic heater of claim 12, wherein said at least one connecting member has an electrical resistance at room temperature that is not larger than $1/10$ of that of said heat resistor.

17. The ceramic heater of claim 12, wherein said substrate comprises a plate having a thickness of at least 3 mm and not more than 25 mm.

18. The ceramic heater of claim 12, wherein said heat resistor is embedded in said substrate along a plane that is substantially parallel with said mounting face of said substrate.

19. The ceramic heater of claim 12, wherein said heat resistor comprises at least one of a mesh, a wire and a winding.

20. A ceramic heater comprising a ceramic substrate having a mounting face for an object to be heated, a heat resistor embedded in said substrate, said heat resistor having an end portion, and at least one connecting member electrically connected with said end portion of said heat resistor;

wherein at least a portion of said at least one connecting member has a substantially cylindrical outer shape, said portion comprising a pair of caulking pieces and an elongate groove formed between said caulking pieces, said elongate groove fixing said end portion of said heat resistor by caulking;

wherein a plurality of said heat resistors are embedded in said substrate, and at least two of said heat resistors having different shapes with respect to each other are connected with each other through said at least one connecting member; and wherein said at least two heat resistors comprise conductive wires having different wire diameters with respect to each other.

21. A ceramic heater comprising a ceramic substrate having a mounting face for an object to be heated, a heat resistor embedded in said substrate, said heat resistor having an end portion, and at least one connecting member electrically connected with said end portion of said heat resistor;

wherein at least a portion of said at least one connecting member has a substantially cylindrical outer shape, said portion comprising a pair of caulking pieces and an elongate groove formed between said caulking pieces, said elongate groove fixing said end portion of said heat resistor by caulking;

wherein a plurality of said heat resistors are embedded in said substrate, and at least two of said heat resistors having different shapes with respect to each other are connected with each other through said at least one connecting member; and wherein said at least two heat resistors comprise windings having different coil diameters with respect to each other.

* * * * *